US008286121B2

(12) United States Patent
Wang et al.

(10) Patent No.: US 8,286,121 B2
(45) Date of Patent: Oct. 9, 2012

(54) PRECONDITIONING FOR EDA CELL LIBRARY

(75) Inventors: Xin Wang, Pasadena, CA (US); Charles C. Chiang, Saratoga, CA (US)

(73) Assignee: Synopsys, Inc., Mountain View, CA (US)

( * ) Notice: Subject to any disclaimer, the term of this patent is extended or adjusted under 35 U.S.C. 154(b) by 462 days.

(21) Appl. No.: 12/623,027

(22) Filed: Nov. 20, 2009

(65) Prior Publication Data

US 2010/0070938 A1 Mar. 18, 2010

Related U.S. Application Data

(62) Division of application No. 10/943,662, filed on Sep. 16, 2004, now Pat. No. 7,644,378.

(51) Int. Cl.
G06F 11/22 (2006.01)
G06F 17/50 (2006.01)
G06F 9/455 (2006.01)

(52) U.S. Cl. ............................ 716/134; 716/136

(58) Field of Classification Search .............. 716/134, 716/136
See application file for complete search history.

(56) References Cited

U.S. PATENT DOCUMENTS

| | | | |
|---|---|---|---|
| 6,272,664 B1 | 8/2001 | Chang et al. | |
| 6,327,557 B1* | 12/2001 | Croix | 703/14 |
| 6,732,341 B1 | 5/2004 | Chang et al. | |
| 2004/0025136 A1 | 2/2004 | Carelli | |
| 2005/0278658 A1 | 12/2005 | Zhang et al. | |
| 2006/0015831 A1 | 1/2006 | Varshney et al. | |
| 2006/0026543 A1 | 2/2006 | Jayaraman et al. | |
| 2006/0253810 A1 | 11/2006 | Guardiani et al. | |

OTHER PUBLICATIONS

F. Wang and Shir-Shen Chang, "Scalable Polynomial Delay Model for Logic and Physical Synthesis", The 16th IFIP World Computer Congress, ICDA, Aug. 2000. on VLSI Systems, vol. 7, No. 4, Dec. 1999.
Wen-Tsong Shiue and Weetit Wanalertlak, "Advanced Cell Modeling Techniques Based on Polynomial Expressions," IEEE 13th International Workshop on Power and Timing Modeling, Optimization and Simulation, Torino, Italy, Sep. 10-12, 2003.
Wen-Tsong Shiue and Weetit Wanalertlak, "An Advanced Cell Polynomial-Base Modeling for Logic Synthesis," IEEE International SOC Conference, Portland Oregon, Sep. 2003.
Synopsys SPDM web page, http://www.synopsys.com/products/library/lib_comp_spdm.html.
ESNUG 420 Item 10 (Oct. 22, 2003), http://www.deepchip.com/items/0420-10.html.

(Continued)

*Primary Examiner* — Suresh Memula
(74) *Attorney, Agent, or Firm* — Bever, Hoffman & Harms, LLP; Jeanette S. Harms

(57) ABSTRACT

A characterized cell library for EDA tools includes one or more mathematical models for each cell, and one or more preconditioning functions (and/or inverse preconditioning functions) for each mathematical model. Each mathematical model represents a performance parameter (e.g., delay, power consumption, noise) or a preconditioned performance parameter of the cell. The preconditioning functions convert an operating parameter (e.g., input slew, output capacitance) associated with the performance parameter into a preconditioned input variable for the mathematical models. In doing so, the preconditioning functions allow for more accurate modeling of complex data relationships without increasing the complexity (e.g., order and number of coefficients) of the mathematical models. Also, because the cell library can be substantially similar to conventional polynomial-based cell libraries except for the inclusion of preconditioning functions, preconditioning does not significantly increase storage requirements and conventional EDA tools can be readily adapted to use the preconditioned cell library.

5 Claims, 11 Drawing Sheets

OTHER PUBLICATIONS

M. Cirit, "Libraries with Scalable Polynomial Delay Model Improve Modeling Accuracy", isd Magazine, Jul. 2001, pp. 56-59.

Design Compiler FPGA—Design Once information sheet, http://www.synopsys.com/products/dcfpga/dcfpga_bgr.pdf.

* cited by examiner

PERFORMANCE
PARAMETER
TABLE
101

| CELL 100:<br>TIMING ARC<br>111-133 |    | X1   | X2   | X3   | X4   | X5   | X6   |
|---|----|------|------|------|------|------|------|
| | Y1 | PP11 | PP12 | PP13 | PP14 | PP15 | PP16 |
| | Y2 | PP21 | PP22 | PP23 | PP24 | PP25 | PP26 |
| | Y3 | PP31 | PP32 | PP33 | PP34 | PP35 | PP36 |
| | Y4 | PP41 | PP42 | PP43 | PP44 | PP45 | PP46 |

FIG. 1C

CELL LIBRARY
ENTRY
102

| CELL 100:<br>TIMING ARC<br>111-133 | PP = FN1(X, Y) |
|---|---|

FIG. 1D
(PRIOR ART)

PRECONDITIONING FOR EDA CELL LIBRARY

RELATED APPLICATIONS

This application is a divisional of U.S. patent application Ser. No. 10/943,662, entitled "Preconditioning For EDA Cell Library" filed Sep. 16, 2004.

BACKGROUND OF THE INVENTION

1. Field of the Invention

The invention is in the field of electronic design automation (EDA), and more particularly, is related to cell libraries for efficient modeling of device properties.

2. Related Art

An electronic design automation (EDA) system is a computer software system used for designing integrated circuit (IC) devices. The EDA system typically receives one or more high level behavioral descriptions of an IC device (e.g., in HDL languages like VHDL, Verilog, etc.) and translates ("synthesizes") this high level design language description into netlists of various levels of abstraction. A netlist describes the IC design and is composed of nodes (functional elements) and edges, e.g., connections between nodes. At a higher level of abstraction, a generic netlist is typically produced based on technology independent primitives.

The generic netlist can be translated into a lower level technology-specific netlist based on a technology-specific (characterized) cell library that has gate-specific models for each cell (functional element). The models define performance parameters for the cells; e.g., parameters related to the operational behavior of the cells, such as power consumption, delay, transition time, and noise. The netlist and cell library are typically stored in computer readable media within the EDA system and are processed and verified using many well-known techniques.

Before proceeding further with the description, it may be helpful to place these processes in context. FIG. 1A shows a simplified representation of an exemplary digital ASIC design flow. At a high level, the process starts with the product idea (step E100) and is realized in an EDA software design process (step E110). When the design is finalized, it can be taped-out (event E140). After tape out, the fabrication process (step E150) and packaging and assembly processes (step E160) occur resulting, ultimately, in finished chips (result E170).

The EDA software design process (step E110) is actually composed of a number of steps E112-E130, shown in linear fashion for simplicity. In an actual ASIC design process, the particular design might have to go back through steps until certain tests are passed. Similarly, in any actual design process, these steps may occur in different orders and combinations. This description is therefore provided by way of context and general explanation rather than as a specific, or recommended, design flow for a particular ASIC.

A brief description of the components steps of the EDA software design process (step E110) will now be provided:

System design (step E112): The designers describe the functionality that they want to implement and can perform what-if planning to refine functionality, check costs, etc. Hardware-software architecture partitioning can occur at this stage. Exemplary EDA software products from Synopsys, Inc. that can be used at this step include Model Architect, Saber, System Studio, and DesignWare® products.

Logic design and functional verification (step E114): At this stage, the VHDL or Verilog code for modules in the system is written and the design is checked for functional accuracy. More specifically, the design is checked to ensure that it produces the correct outputs. Exemplary EDA software products from Synopsys, Inc. that can be used at this step include VCS, VERA, DesignWare®, Magellan, Formality, ESP and LEDA products.

Synthesis and design for test (step E116): Here, the VHDL/Verilog is translated into a netlist. The netlist can be optimized for the target technology. Additionally, the design and implementation of tests to permit checking of the finished chip occurs. Exemplary EDA software products from Synopsys, Inc. that can be used at this step include Design Compiler®, Physical Compiler, Test Compiler, Power Compiler, FPGA Compiler, Tetramax, and DesignWare® products.

Design planning (step E118): Here, an overall floorplan for the chip is constructed and analyzed for timing and top-level routing. Exemplary EDA software products from Synopsys, Inc. that can be used at this step include Jupiter and Floorplan Compiler products.

Netlist verification (step E120): At this step, the netlist is checked for compliance with timing constraints and for correspondence with the VHDL/Verilog source code. Exemplary EDA software products from Synopsys, Inc. that can be used at this step include VCS, VERA, Formality and PrimeTime products.

Physical implementation (step E122): The placement (positioning of circuit elements) and routing (connection of the same) occurs at this step. Exemplary EDA software products from Synopsys, Inc. that can be used at this step include the Astro product.

Analysis and extraction (step E124): At this step, the circuit function is verified at a transistor level, this in turn permits what-if refinement. Exemplary EDA software products from Synopsys, Inc. that can be used at this step include Star RC/XT, Raphael, and Aurora products.

Physical verification (step E126): At this step various checking functions are performed to ensure correctness for: manufacturing, electrical issues, lithographic issues, and circuitry. Exemplary EDA software products from Synopsys, Inc. that can be used at this step include the Hercules product.

Resolution enhancement (step E128): This step involves geometric manipulations of the layout to improve manufacturability of the design. Exemplary EDA software products from Synopsys, Inc. that can be used at this step include iN-Phase, Proteus, and AFGen products.

Mask data preparation (step E130): This step provides the "tape-out" data for production of masks for lithographic use to produce finished chips. Exemplary EDA software products from Synopsys, Inc. that can be used at this step include the CATS(R) family of products.

In general, a characterized cell library can be used in the steps of synthesis, design planning, netlist verification, physical implementation, and analysis (as indicated by the bolded chevrons).

FIG. 1B illustrates an example cell 100. Cell 100 represents an AND-OR-Invert (AOI) gate formed by AND gates 110 and 120 and an OR gate 130, with the outputs of AND gates 110 and 120 being tied to the inputs of OR gate 130. A characterized library entry associated with cell 100 would typically include performance parameter information for cell 100 across a range of operating conditions. For example, because each of AND gates 110 and 120 includes two inputs, cell 100 includes at least four paths (i.e., input 111 to output 133, input 112 to output 133, input 121 to output 133, and input 122 to output 133) for which delay, power, noise, and other performance parameters can be specified.

The performance parameter data associated with the cells in a characterized cell library is typically provided across a range of operating parameter values (e.g., values for input slew, output capacitance, voltage (e.g., cell operating voltage), and temperature), and can be provided by a foundry or can be calculated via a simulation program such as SPICE. The performance parameter data therefore may originally be compiled as a set of discrete data points.

For example, FIG. 1C, shows a sample performance parameter table 101 for one timing arc of the timing path from input 111 to output 133 of cell 100 (shown in FIG. 1B). For example, the timing arc could be the fall/rise delay arc or the fall/rise transition time arc. For the sake of simplicity, the timing arc is shown as a function of two operational parameters, although in other embodiments, the timing arc could be a function of any number of operational parameters (if more than two operational parameters are considered, a multi-dimensional table or multiple two-dimensional tables would be required).

Table 101 could be an entry in a cell library, and includes performance parameter values PP11-PP46 and two sets of operational parameter values X1-X6 and Y1-Y4. Performance parameter values PP11-PP46 can represent values for any single type of performance parameter (e.g., delay, noise, or power consumption), operational parameter values X1-X6 can represent values for a first operational parameter (e.g., input slew, output capacitance, temperature, or voltage), while operational parameter values Y1-Y4 can represent values for a second operational parameter.

Each performance parameter value is referenced by a particular combination of operational parameter values (i.e., performance parameter value PP11 is generated by the combination of operational parameter values X1 and Y1). Thus, for example, PP11 could represent the delay from input 111 to output 133 for an output (load) capacitance X1 and an input slew Y1. Note that interpolation or extrapolation may be required if the desired operational condition (i.e., the desired combination of operations parameter values) is not listed in the table. For example, if the operational parameter values are X5 and Y5, with X1<X5<X2 and Y2<Y5<Y3, then PP21, PP22, PP31 and PP32 may be used to calculate the performance parameter value at (X5,Y5) using interpolation.

Note that while performance parameter table 101 is relatively small for exemplary purposes, typical performance parameter tables will be much larger, as performance parameter values will be provided for many more combinations of operating parameter values in order to produce more accurate performance information and/or provide improved interpolation/extrapolation capabilities. Therefore, look-up tables can consume relatively large amounts of storage space and memory resources within an EDA system. For example, a single library can contain tens of thousands of look-up tables. In addition, each look-up tables may require a large number of data points if high interpolation and/or extrapolation accuracy is desired. The resulting large number of large lookup tables can be cumbersome for EDA tools (e.g., synthesis or analysis tools) and can significantly increase computational requirements and modeling time. Therefore, modern characterized cell libraries may choose to replace lookup tables with mathematical models (typically SPM formulas) of cell behavior.

For example, some early mathematical models of functional element timing were based on fixed-form linear equations of input slew and output capacitance load. Later, these timing models (e.g., for generic CMOS) were based on a linear equation including both of these two variables (with fixed coefficients) and, similarly, the same linear equation form was used to model all of the gates of a given technology library. Although the linear equation form was the same for all gates, the coefficients of the linear equation could change from timing arc to timing arc within the same technology library. This allowed the timing calculations to be generalized across the entire technology library and thereby made the timing calculations easier to perform. However, the calculations were not entirely accurate because some library gates were not well modeled by the fixed-form linear equation.

Recently, advanced cell libraries have begun to incorporate scalable polynomial-based models ("SPM models") to specify cell performance parameters, as described in co-owned U.S. Pat. No. 6,732,341, issued May 4, 2004 to Chang et al., herein incorporated by reference. Replacing look-up table models with polynomial models significantly reduces memory usage, while increasing computation speed for tools that make use of the cell library (e.g., synthesis tools and static timing analysis tools).

For example, FIG. 1D shows a sample cell library entry 102 generated from table 101 in FIG. 1C. The performance parameter values associated with each different combination of operational parameter values (X1-X4 and Y1-Y4) have been replaced with a polynomial function FN1 of operational parameters X and Y. Typically, a predetermined polynomial form is used for function FN1, so that only the coefficients of the polynomial function FN1 are stored in the library. In doing so, the size of cell library entry 102 can be significantly reduced over table 101 shown in FIG. 1C.

The particular form of polynomial function FN that is used for modeling purposes is typically selected from a set of scalable polynomial systems (e.g., the decomposed Taylor Series and the Joint Taylor Series), and can have different orders (e.g., first, second, third, etc.) with respect to the input variables. The lower the orders used in the polynomial forms in a library, the less computationally expensive are the analyses performed using that library.

For example, if the order of the polynomial using decomposed Taylor series is 2 (i.e., the highest order for each variable in the polynomial form is 2), and the function has 4 operation parameters, the total number of polynomial terms is $(2+1)^4=81$. However, if the order of the polynomial is 3, the total number of polynomial terms jumps to $(3+1)^4=256$. Therefore, it is extremely beneficial to limit the order of the library polynomial forms to minimize the number of polynomial terms, thereby minimizing polynomial model derivation and usage complexity.

However, as device sizes continue to shrink, the performance parameters of those devices become more nonlinear, and hence more difficult to fit with conventional polynomial models. Although high-order polynomials or piecewise polynomials may be used to achieve better fitting accuracy, both have limitations. High-order polynomials require more terms and have the undesirable high-order oscillations that may cause large errors in certain fitting regions of performance parameter data. Piecewise polynomials can avoid such oscillations, but can require a large number of polynomials to provide an accurate fit.

In either case, the large number of coefficients of both high-order polynomials and piecewise polynomials can make such approaches unattractive solutions to the problem of excessive library size and computational requirements. These shortcomings of high-order polynomials and piecewise polynomials only become more pronounced as device sizes continue to rapidly scale down and more operational parameters start to affect performance parameters.

Furthermore, it is well known that a polynomial form has difficulty in accurately modeling/representing certain very nonlinear behavior (e.g., exponential functions). In such cases, a conventional scalable polynomial representation of the data is neither efficient nor robust.

Accordingly, it is desirable to provide a method and system that can accurately model all types of performance parameter distributions without significantly increasing computational and storage requirements.

SUMMARY OF THE INVENTION

To improve mathematical model accuracy without unduly increasing cell library size or analytical complexity, preconditioning (or mapping) of operational parameters and/or even performance parameters can be used. For example, in one embodiment, a characterized cell model can be generated by applying a preconditioning function to operating parameter values that reference a set of performance parameter values for a cell. The performance parameter for the cell is then modeled as a function of the preconditioned operational parameter, thereby providing greater modeling capabilities with a minimal increase in library storage requirements and computational complexity. For example, certain nonlinear patterns that are difficult to model using polynomial can be accurately modeled through the use of simple preconditioning functions (e.g., exponential functions, logarithmic functions, and rational functions). The use of preconditioning functions to "translate" from operational parameter values to preconditioned values in this manner can significantly reduce the difficult-to-model nonlinearity to be accommodated by the mathematical model (e.g. polynomial model), and thus provide dramatically improved modeling accuracy without increasing the order or complexity of the actual model.

An entry in a characterized cell library can therefore include the mathematical model of the preconditioned operational parameters and the preconditioning functions. When the library is used by EDA tools, the preconditioning function(s) can first be applied to the operational parameters, after which the mathematical model can be applied to calculate the performance parameters using the preconditioned operational parameters. Performance parameter preconditioning functions may also be applied to "translate" performance parameters to preconditioned performance parameters that are then modeled by the mathematical models during the model characterization stage. In this case the library can also include the inverse preconditioning function(s) for those preconditioned performance parameters. Then, when the library is used by EDA tools, the mathematical model can be applied to calculate the preconditioned performance parameters, after which the inverse preconditioning function(s) can be applied to "translate" the preconditioned performance parameters back to the actual performance parameter values to be used by EDA tools.

Because the characterized library can be implemented with minimal change to conventional polynomial-based libraries (i.e., by simply incorporating appropriate preconditioning functions), the benefits of preconditioning can be achieved using conventional EDA tools without requiring major modification. This "preconditioned" cell library can be stored on and accessed from any type of computer-readable medium (e.g., CDROM, DVD, hard drive, network server).

According to various embodiments, the mathematical model for a cell can be a function of one or more preconditioned operational parameters, and any number of additional non-preconditioned operational parameters. The preconditioning function can be a linear function, a nonlinear function, or a function of two or more operational parameters (e.g., for merging multiple input variables into a single input variable for the mathematical model).

In one embodiment, an EDA analysis tool can perform an analysis of an IC design by using a characterized cell library that includes one or more mathematical models for cell performance parameters that are functions of preconditioned operational parameters. The analysis could be performed by selecting a cell in the design, applying preconditioning functions to one or more operational parameter values for the cell, and then substituting the preconditioned operational parameter value into the mathematical model for a performance parameter of the cell. Note that if performance parameter values are preconditioned, then the output of the above mathematical model is a preconditioned performance parameter value, from which a final performance parameter value can be derived using the inverse preconditioning function.

The invention will be more fully understood in view of the following description and drawings.

BRIEF DESCRIPTION OF THE DRAWINGS

FIG. 1C is a sample table of performance parameter data that could be associated with the cell of FIG. 1B.

FIG. 1D is a conventional polynomial-based cell library entry that could be associated with the table of FIG. 1C.

DETAILED DESCRIPTION

Figure 2A:
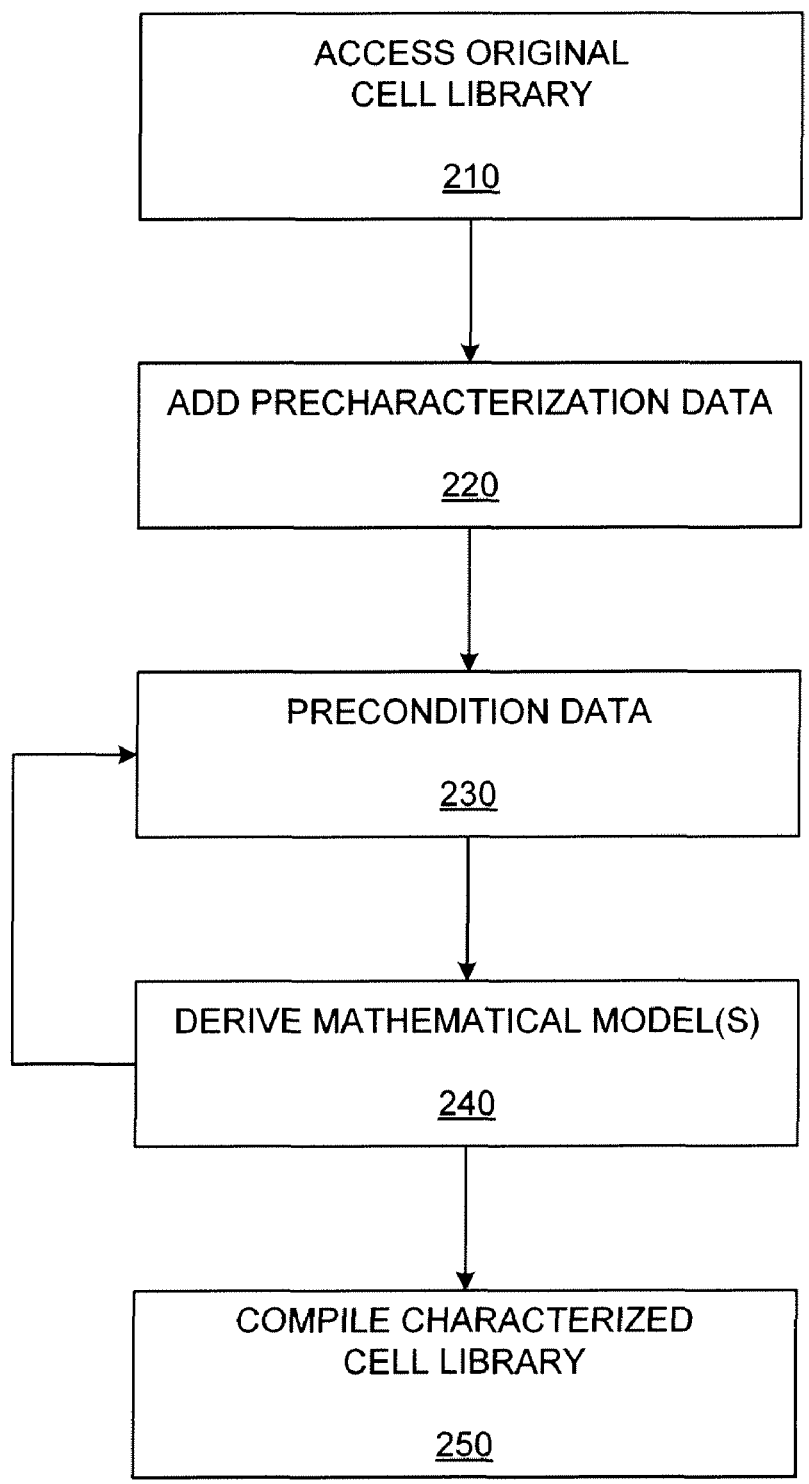
FIGS. 2A and 2B are flow diagrams of a characterized cell creation process.

Conventional characterized cell libraries are derived by modeling performance parameter data referenced by operational parameters. As noted above, providing a desired level of modeling accuracy using those conventional means can result in excessive computational and storage requirements. FIG. 2A shows a flow diagram for the generation of a characterized cell library generation process that overcomes these problems.

In an "ACCESS ORIGINAL CELL LIBRARY" step 210, a set of functional elements (cells) is accessed (typically by being read into the memory of a computer system). As is known in the art, this set can include any number and type of functional elements, including AND gates, OR gates, inverters, latches, multiplexers, half adders, and full adders, to name a few.

In some embodiments, the original cell library can also include technology-specific performance parameter data (e.g., provided by a foundry or generated via simulation of the functional elements using a simulator such as SPICE). In other embodiments, the performance parameter data can then be associated with the functional elements in an optional "ADD PRECHARACTERIZATION DATA" step 220. In any case, the performance parameter data provides a set of performance parameter values, each of which is referenced by particular values of one or more types of operational parameters.

Then, in a "PRECONDITION DATA" step 230, one or more preconditioning functions can be applied to the operating parameter values associated with each set of performance parameter data, and/or to the performance parameter data. For example, a set of delay data for a given timing arc might be associated with a set of operating parameter values that include a set of input slew values, a set of output capacitance values, a set of temperature values, and a set of voltage (e.g., cell voltage) values. Preconditioning functions can be applied to one or more of those operating parameter data sets and/or the performance parameters to generate a set of preconditioned values (as described in greater detail below with respect to FIG. 3A).

Next, in a "DERIVE MATHEMATICAL MODEL(S)" step 240, the preconditioned operational parameter values generated in step 230 can be used as input variables to derive mathematical models for the different cells in the library. In one embodiment, the mathematical models can comprise SPM models. Each mathematical model provides a model of the behavior of a particular performance parameter for a particular cell, as a function of one or more preconditioned operational parameters. For example, according to an embodiment of the invention, a mathematical model for delay can be a function of output capacitance preconditioned by a first function, and of input slew preconditioned by a second function.

Note that step 240 can be performed in any manner that provides a desired level of accuracy in modeling the relationship between the performance parameter values and the preconditioned operational parameter values generated in step 230. For example, according to an embodiment of the invention, the mathematical model derivation of step 240 can be performed via the method for translating look-up tables into scalable polynomial models described in U.S. Pat. No. 6,732,341, by substituting preconditioned operating parameter values and/or performance parameter values for the "raw" (i.e., non-preconditioned) operating parameter values and/or performance parameter values, respectively, used in U.S. Pat. No. 6,732,341.

Note further that the process can loop back to step 230 if the desired accuracy is not achieved using the existing preconditioned operational parameter data values. A new preconditioning function(s) could then be applied to the raw operational parameter and/or performance parameter data in step 230, and the new set(s) of preconditioned operating parameter data values and/or performance parameter data values, respectively, could then be used in the mathematical model derivation of step 240. Once the desired model accuracy is achieved, the mathematical models can be compiled into a final characterized cell library in a "COMPILE CELL LIBRARY" step 250. Note that while the original cell library accessed in step 210 will typically represent an uncharacterized cell library, in various other embodiments, the original cell library can represent a characterized cell library having a first data format (e.g., non-linear delay model (NLDM) format) that is translated into a characterized cell library (via steps 230 through 250) having a different mathematical model format (e.g., SPM format).

Figure 2B:
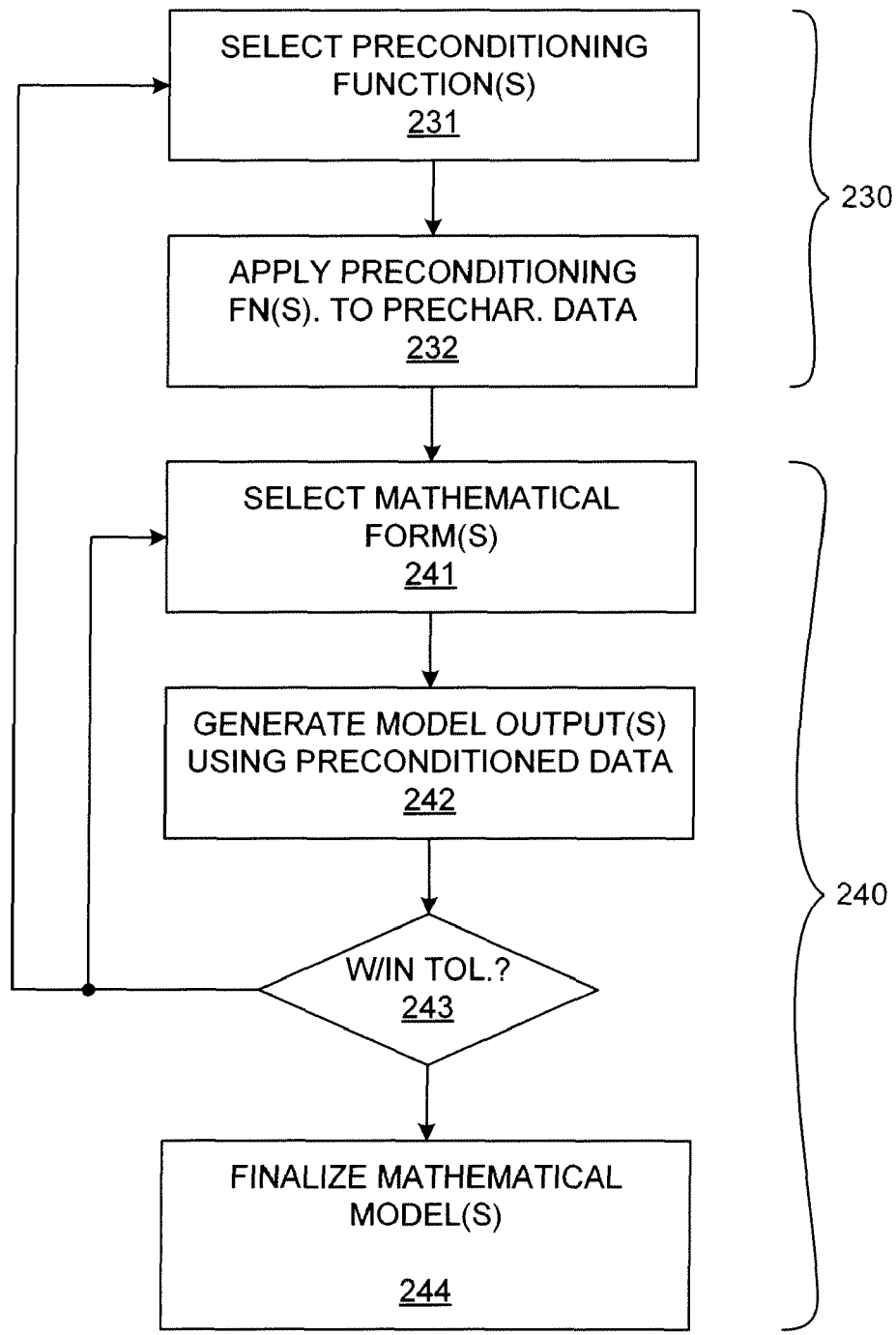

FIG. 2B shows a detailed embodiment of steps 230 and 240 (in FIG. 2A). Step 230 can begin with the selection of one or more preconditioning functions in a "SELECT PRECONDITIONING FUNCTION(S)" step 231. The preconditioning functions can be selected in a variety of ways, including selection based on "known good" preconditioning functions (e.g., preconditioning functions that have provided desirable results in previous modeling efforts), or selection from a predefined set of preconditioning functions. Note also that while linear preconditioning functions may sometimes be useful to improve numerical stability during the subsequent model derivations, nonlinear preconditioning functions (e.g., exponential or logarithmic functions) will typically provide greater benefit in improving the accuracy of the final mathematical model.

The one or more selected preconditioning functions can then be applied to one or more sets of operational parameter and/or performance parameter values in an "APPLY PRECONDITIONING FUNCTION(S) TO PRECHARACTERIZED DATA" step 232. Note that according to various embodiments, preconditioning may be applied to some or all of the sets of operational parameter values and performance parameter values, and that different preconditioning functions may be applied to different sets of operational parameter or performance parameter values.

Then, step 240 can begin with a "SELECT MATHEMATICAL FORM(S) step 241, in which mathematical forms for the performance parameters of interest are selected. The mathematical forms can be functions of the preconditioned operational parameter values and/or can generate preconditioned performance parameter values. In one embodiment, polynomials or piecewise polynomials for an SPM model are chosen.

Modeling of the precharacterized data is then performed using the mathematical form(s) from step 241 in a "GENERATE MODEL OUTPUT(S) USING PRECONDITIONED DATA" step 242, and the fit provided by the mathematical model output is then evaluated in a "WITHIN TOLERANCE?" step 243. Note that preconditioning functions can be applied to some or all of the operational parameter data and/or the performance parameter data. Note further that if a preconditioning function is applied to the performance parameter data, the output of the mathematical model is the preconditioned version of the performance parameter data, which can be converted back to the actual performance parameter data via the inverse function of the preconditioning function.

The process then iterates, looping back to step 241 to adjust the mathematical forms (e.g., by changing coefficients or changing the order of a polynomial or changing the regions of piecewise polynomials) until a desired fit is achieved. The iterative process can also loop back to step 231, and a different preconditioning function(s) can be applied to the sets of operational parameter values and/or the performance parameter values. Once the desired model accuracy is detected in step 243, the mathematical models can be finalized in a "FINALIZE MATHEMATICAL MODEL(S)" step 244 to complete step 240.

Figure 1A:
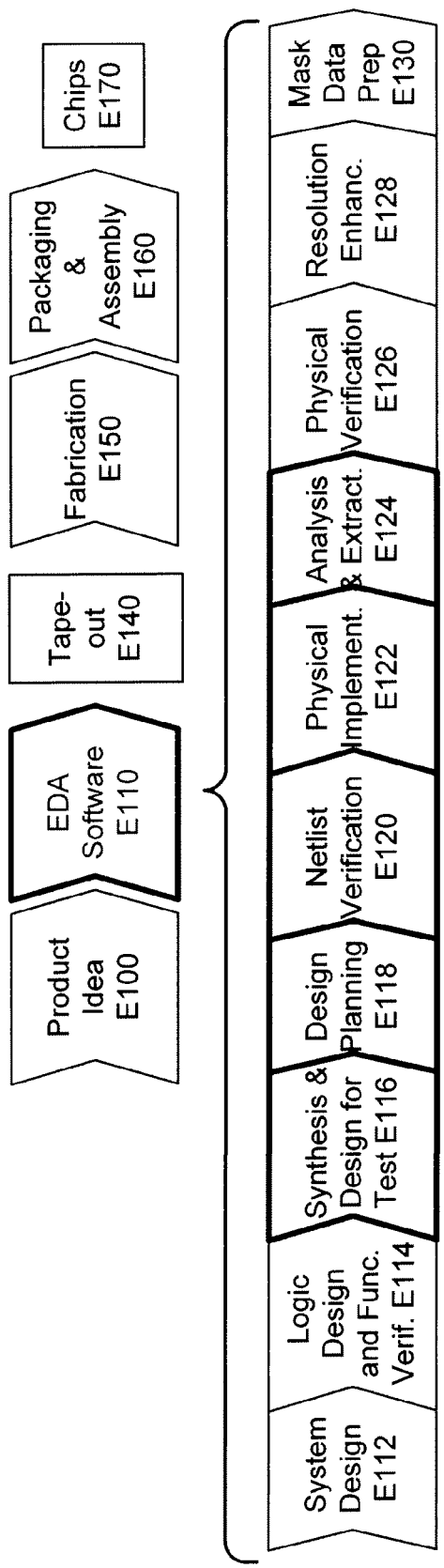
FIG. 1A is a process flow diagram for a general EDA design flow.
Figure 1B:
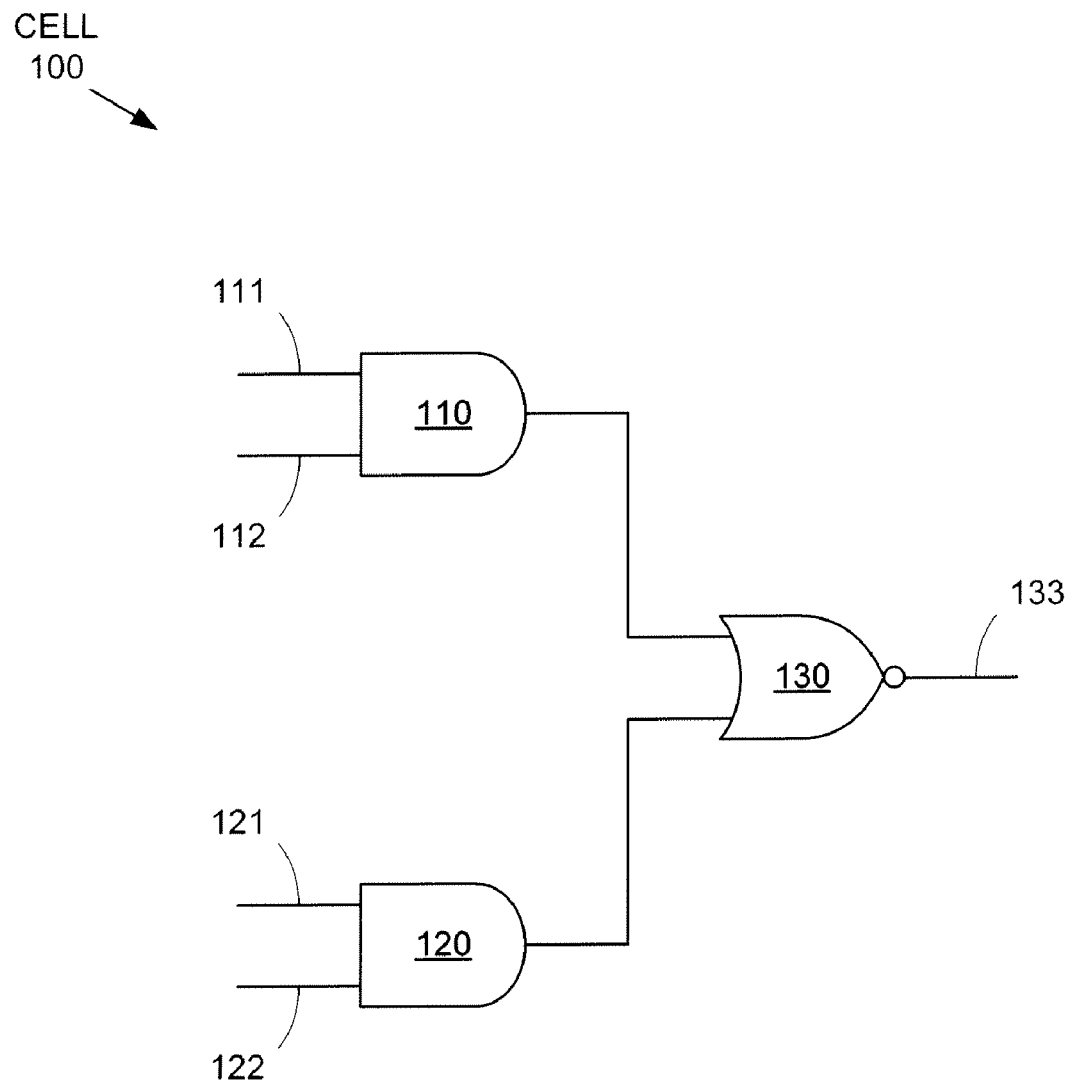
FIG. 1B is a schematic diagram of a sample cell that can be included in a cell library.
Figure 3A:
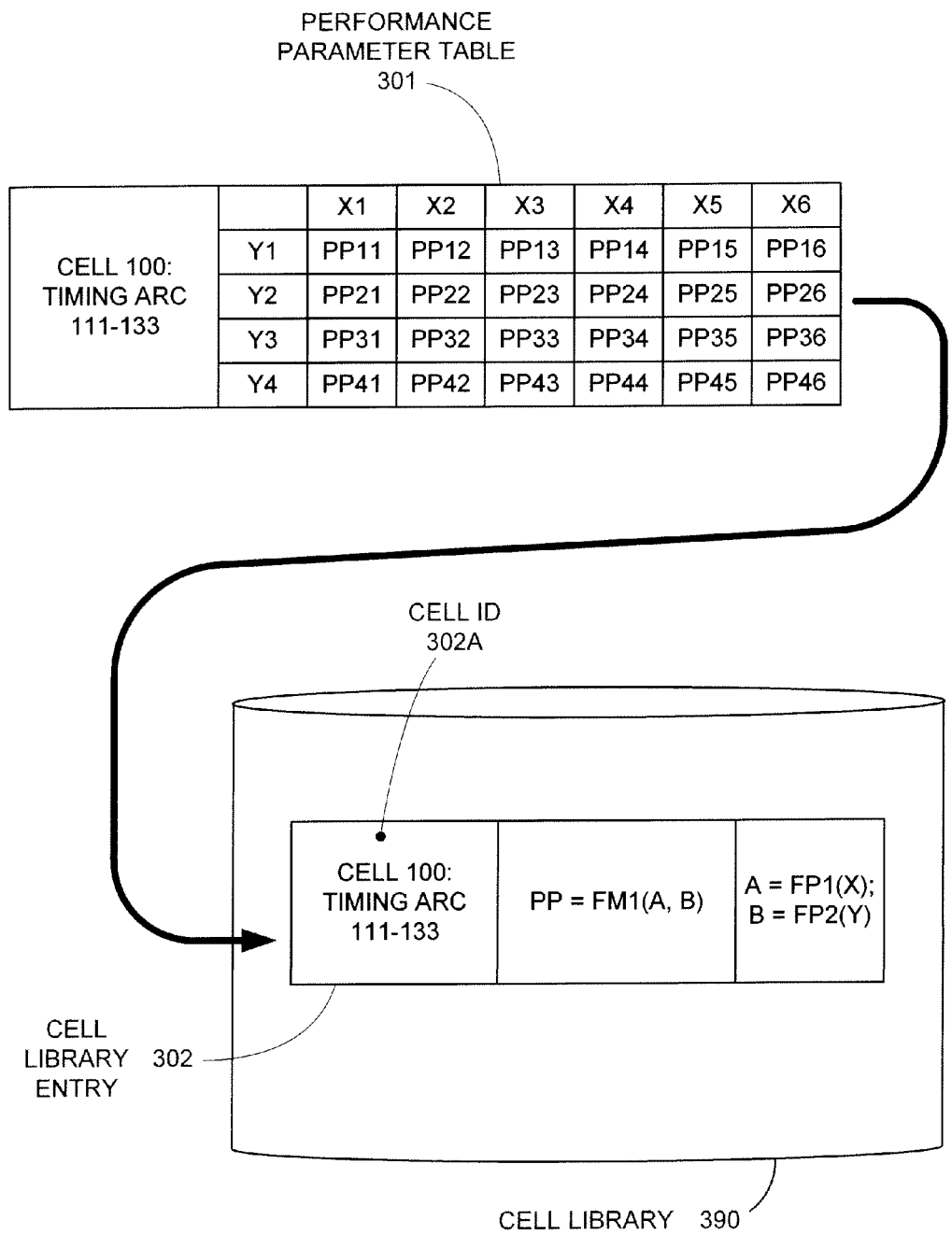
FIG. 3A is a depiction of a translation from a lookup table of cell performance data into a library of mathematical models based on preconditioned operational parameters.

FIG. 3A shows an exemplary graphical representation of the characterized library generation process described with respect to FIG. 2A. In FIG. 3A, a performance parameter table 301 for the timing arc between input 111 and output 133 of cell 100 shown in FIG. 1B includes performance parameter values PP11-PP46 and operational parameter data values X1-X6 and Y1-Y6. Performance parameter values PP11-PP46 can represent values for any single type of performance parameter (e.g., delay, noise, or power consumption), operational parameter values X1-X6 can represent values for a first operational parameter (e.g., input slew, output capacitance, temperature, or voltage), while operational parameter values Y1-Y4 can represent values for a second operational parameter. Note that while only two types of operational parameters (X and Y) are shown for exemplary purposes, the invention can be applied to performance parameter data associated with any number of different types of operational parameters.

Each performance parameter value is referenced by a particular combination of operational parameter values (i.e., performance parameter value PP11 is generated for the combination of operational parameter values X1 and Y1). Thus, for example, PP11 could represent the delay between input 111 and output 133 for an output (load) capacitance X1 and an input slew Y1. Note that while only two types of operational parameters (X and Y) are depicted in table 301 for clarity, the invention can be applied to performance parameter data that includes any number of different operational parameter types.

Using the method described with respect to FIG. 2A, the data in table 301 is translated (indicated by the dark arrow) into a mathematical model FM1 in a cell library entry 302 of a cell library 390. In general, a cell library entry in accordance with the invention includes a cell identifier (e.g., cell ID 302A), a mathematical model for a performance parameter (or a preconditioned performance parameter) of the cell (e.g., model FM1), and one or more preconditioning functions (e.g., functions FP1 and FP2) associated that mathematical model.

Mathematical model FM1 in FIG. 3A is a function of input parameters A and B, which are generated by applying preconditioning functions FP1 and FP2, respectively, to operational parameters X and Y, respectively. In other words, operational parameters X and Y are mapped to input parameters A and B, respectively, using preconditioning functions FP1 and FP2, respectively. A, B, and the performance parameter are then used to fit a SPM model FM1.

Figure 3B:
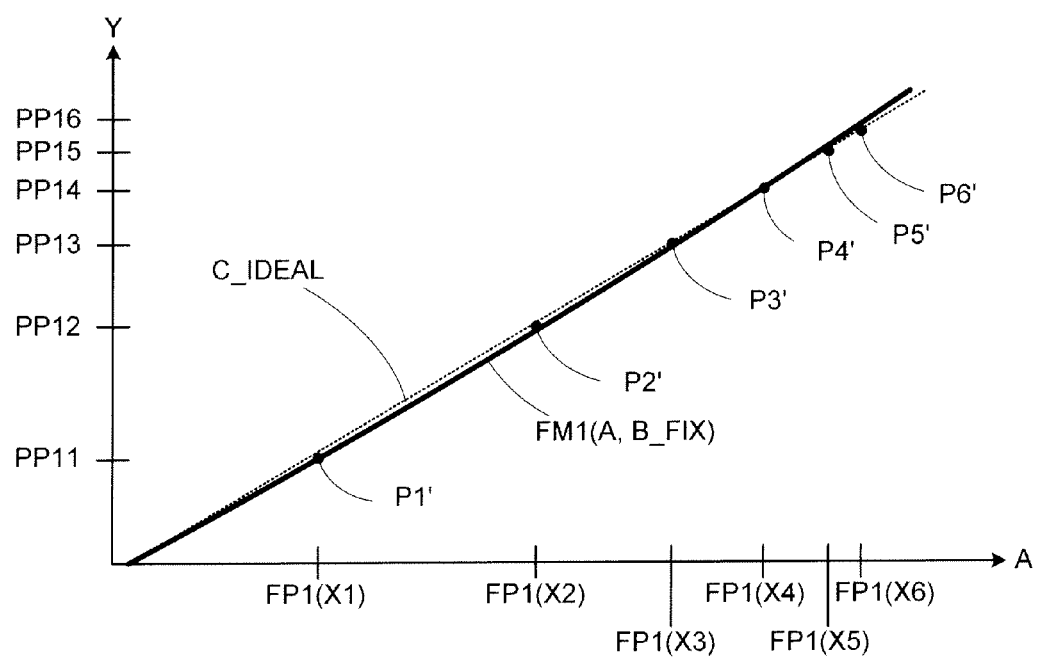
FIG. 3B is a sample graph of performance parameter values versus preconditioned operational parameter values, and a best fit polynomial curve.

FIG. 3B shows an example of the fit that can be achieved through the use of data preconditioning. Performance parameter values PP11-PP16 from FIG. 3A are plotted against input parameter A (i.e., the preconditioned operational parameter X) as points P1'-P6', respectively, with input parameter B held constant at a value B_FIX for clarity. It can be seen that points P1'-P6' exhibit a relatively linear relationship (indicated by idealized curve C_IDEAL) that can be readily modeled by mathematical model FM1.

Note that while mathematical model FM1 described with respect to FIGS. 3A and 3B is a function of two preconditioned operational parameters (input variables) for exemplary purposes, according to various other embodiments of the invention, a mathematical model for a cell can be a function of any number of preconditioned operational parameters.

Figure 3C:
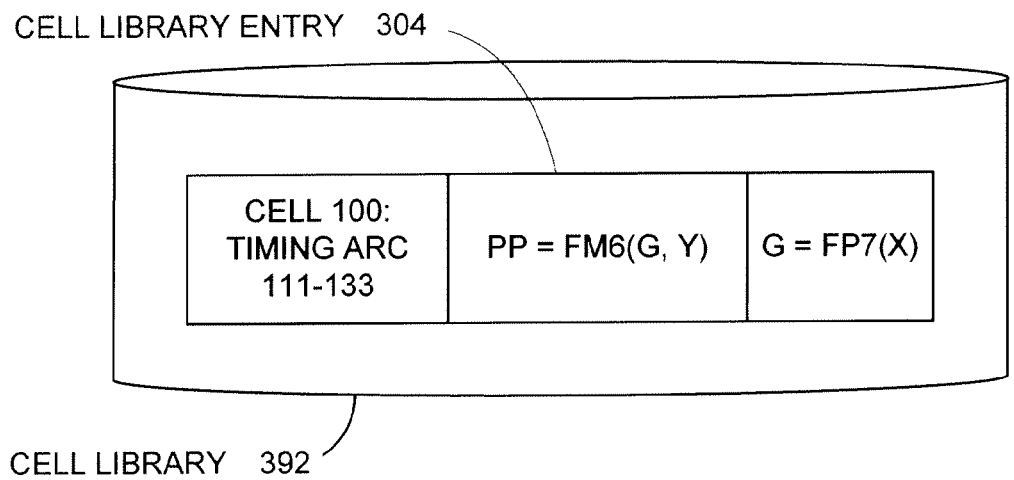
FIGS. 3C-3F are sample cell libraries that include mathematical cell models having a variety of preconditioned and non-preconditioned input variables.

Note further that according to another embodiment of the invention, a mathematical model for a cell can be a function of both preconditioned and raw operational parameters. For example, FIG. 3C shows a cell library 392 that includes a cell library entry 304 in accordance with an embodiment of the invention. Like cell library entry 302 in FIG. 3A, cell library entry 304 models the timing arc between input 111 and output 133 of cell 100 using a single function FM6. However, rather than applying a preconditioning function to all operational parameters, a preconditioning function FP7 is applied only to operational parameter X, so that function FM6 is a function of the preconditioned operational parameter X (i.e., variable G) and the raw operational parameter Y.

Figure 3D:
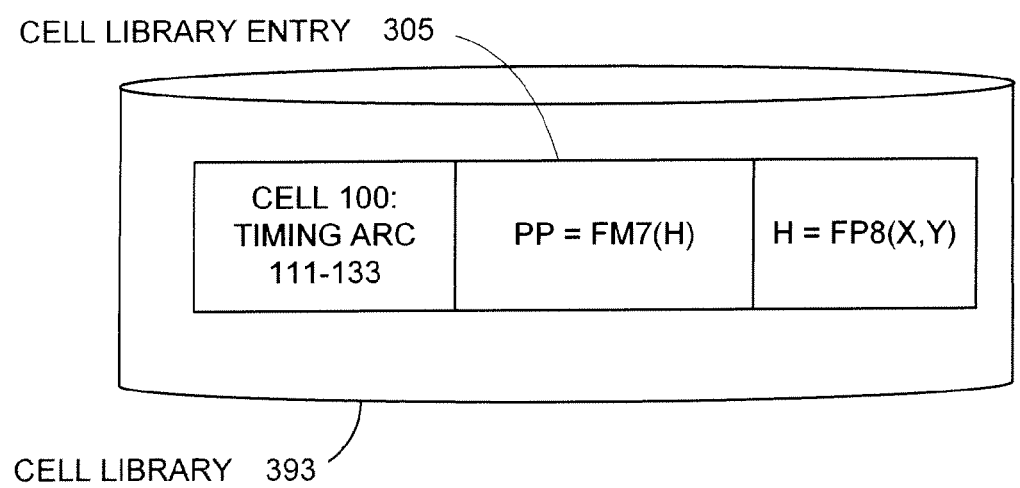

Note further that according to another embodiment of the invention, a preconditioning function can even merge operational parameters. In other words, the preconditioning function itself can be a function of two or more operational parameters. For example, FIG. 3D shows a cell library 393 that includes a cell library entry 305 in accordance with an embodiment of the invention. Like cell library entry 302 in FIG. 3A, cell library entry 305 models the timing arc between input 111 and output 133 of cell 100 using a single function FM7. However, rather than being a function of some combination of preconditioned or raw operational parameters X and Y, function FM7 is a function of a single variable H. Variable H is generated by a preconditioning function FP8 that is a function of both operational parameters X and Y. Preconditioning function FP8 therefore merges two variables (i.e., operational parameters X and Y) into a single modeling variable H, which in turn can reduce the complexity of model function FM7.

Note also that according to another embodiment of the invention, a preconditioning function can be applied to the performance parameter values during creation of the mathematical model. However, because the resulting mathematical model will then generate the preconditioned performance parameter, a cell library entry for such a model will include the "inverse" of the preconditioning function used on the performance parameter values during mathematical model generation. The inverse preconditioning function allows the output of the mathematical model (i.e., preconditioned performance parameter) to be converted back into the actual performance parameter.

Figure 3E:
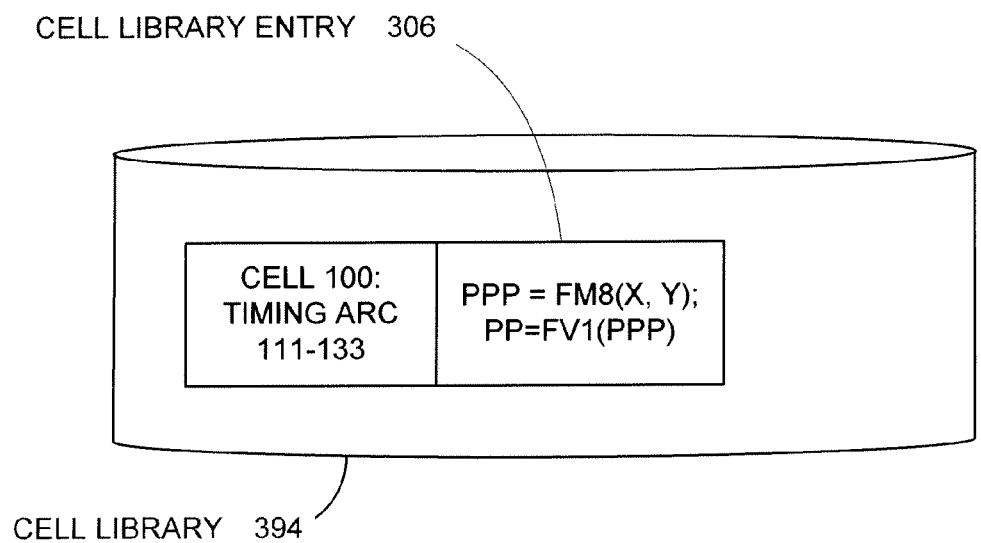

For example, FIG. 3E shows a cell library 394 that includes a cell library entry 306 in accordance with an embodiment of the invention. Like cell library entry 302 in FIG. 3A, cell library entry 306 models the timing arc between input 111 and output 133 of cell 100, but rather than modeling performance parameter PP directly, cell library entry 306 includes a mathematical model FM8 that models a preconditioned performance parameter PPP as a function of operational parameters X and Y. Preconditioned performance parameter PPP represents a preconditioned function of performance parameter PP, and so cell library entry 306 also includes an inverse preconditioning function FV1 that, when applied to preconditioned performance parameter PPP, generates the actual performance parameter PP.

Figure 3F:
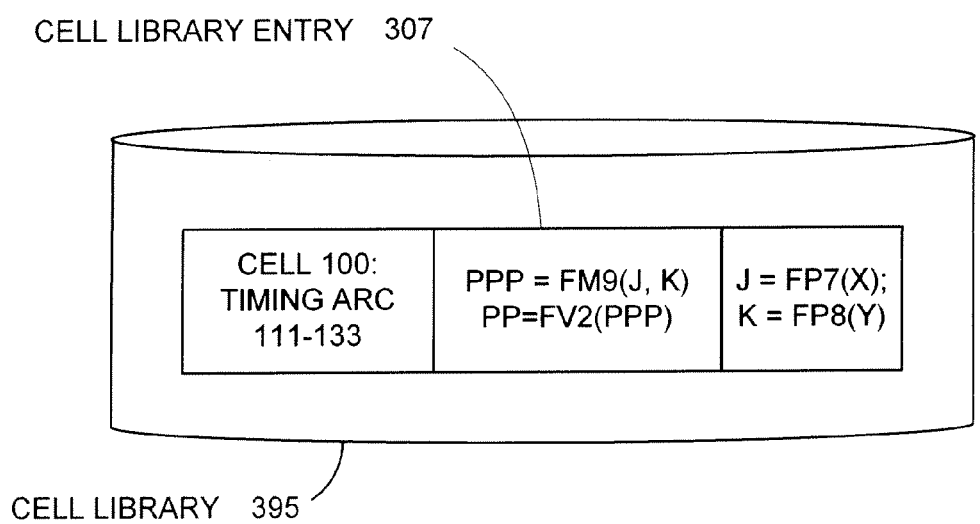

Note that according to another embodiment of the invention, a mathematical model for a preconditioned performance parameter can itself be a function of preconditioned operational parameters. For example, FIG. 3F shows a cell library 395 that includes a cell library entry 307 in accordance with an embodiment of the invention. Like cell library entry 306 in FIG. 3E, cell library entry 307 models the timing arc between input 111 and output 133 of cell 100 in terms of a preconditioned performance parameter PPP. However, the mathematical model FM9 that is used to generate preconditioned performance parameter PPP in cell library entry 307 is a function of input parameters J and K, which are generated by applying preconditioning functions FP7 and FP8, respectively, to raw operational parameters X and Y, respectively. Cell library 307 also includes an inverse preconditioning function FV2 that, when applied to preconditioned performance parameter PPP, generates the actual performance parameter PP.

Figure 4:
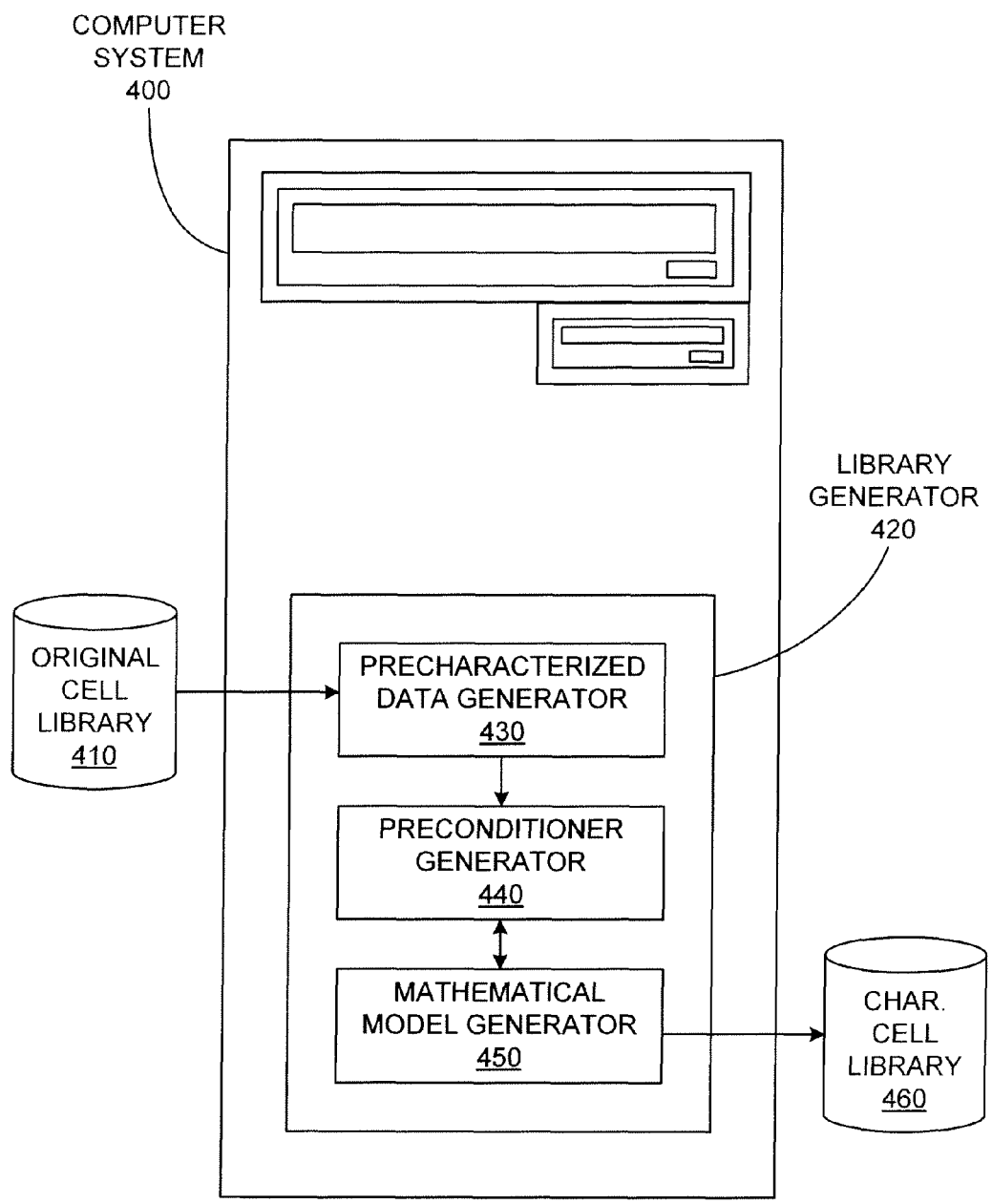
FIG. 4 is a diagram of a computing system that includes logic for generating a characterized cell library using preconditioning functions.

FIG. 4 shows a block diagram of a computer system 400 that includes a library generator 420, in accordance with an embodiment of the invention, for translating an original cell library 410 (e.g., an uncharacterized cell library or a cell library having a format different from the desired one) into a new characterized cell library 460 (e.g., libraries 390, 392, and 393 in FIGS. 3A, 3C, and 3D, respectively) having a desired format (e.g., SPM format). Library generator 420 performs this translation process as described with respect to FIG. 2A. According to an embodiment of the invention, library generator 420 can comprise software stored within computer system 400, software accessed remotely (e.g., run from a network server (not shown)), or software available on any other medium readable by computer system 400.

Library generator 420 includes an optional precharacterized data generator 430, an optional preconditioner generator 440, and a mathematical model generator 450. If original cell library 410 does not include precharacterized data, precharacterized data generator 430 performs a simulation of the cells in library 410 (e.g., SPICE simulation). If library 410 already includes the precharacterized data, precharacterized data generator 430 can be bypassed. Note that according to another embodiment of the invention, precharacterized data generator 430 can be implemented outside of library generator 420 (e.g., in a separate software module or even a separate computer system).

In either case, the precharacterized data provided to preconditioner generator 440 includes one or more sets of performance parameter values (e.g., PP11-PP46 in FIG. 3A) associated with one or more sets of operational parameter values (e.g., X1-X6 and Y1-Y4 in FIG. 3A). Preconditioner generator 440 selects one of the sets of performance parameter values, and can apply one or more preconditioning functions (e.g., functions FP1-FP2 in FIG. 3A) to some or all of the sets of operational parameter values that reference the performance parameter values and/or can apply a preconditioning function (e.g., the inverse of function FV1 in FIG. 3E) to the performance parameter values. The preconditioned data is then passed to mathematical model generator 450, which fits mathematical forms to the performance parameter data (or preconditioned performance parameter data) as referenced by the preconditioned (and any non-preconditioned) operational parameters, thereby generating the mathematical models (e.g., function FM1 in FIG. 3A or function FM6 in FIG. 3E) for the cells in the final characterized cell library 460. Mathematical model generator then writes the characterized cell library 460 to some form of computer-readable medium, such as memory within computer system 400, a removable storage medium (e.g., CDROM or DVD), or a network storage location. Note that according to another embodiment of the invention, writing the final characterized cell library to some form of medium can be performed outside of library generator 420 (e.g., in a separate software module or even a separate computer system).

Note that, as indicated by the double-headed arrow between preconditioner generator 440 and mathematical model generator 450, if the modeling performed by mathematical model generator 450 cannot provide a satisfactory approximation of the preconditioned data (i.e., the model fit to the data does not fall within a predetermined tolerance band), preconditioner generator 440 can apply a different set of preconditioning functions to the precharacterized data to generate a new set of preconditioned data. Mathematical model generator 450 can then use this new set of preconditioned data to derive more accurate mathematical models for the cells.

Figure 5:
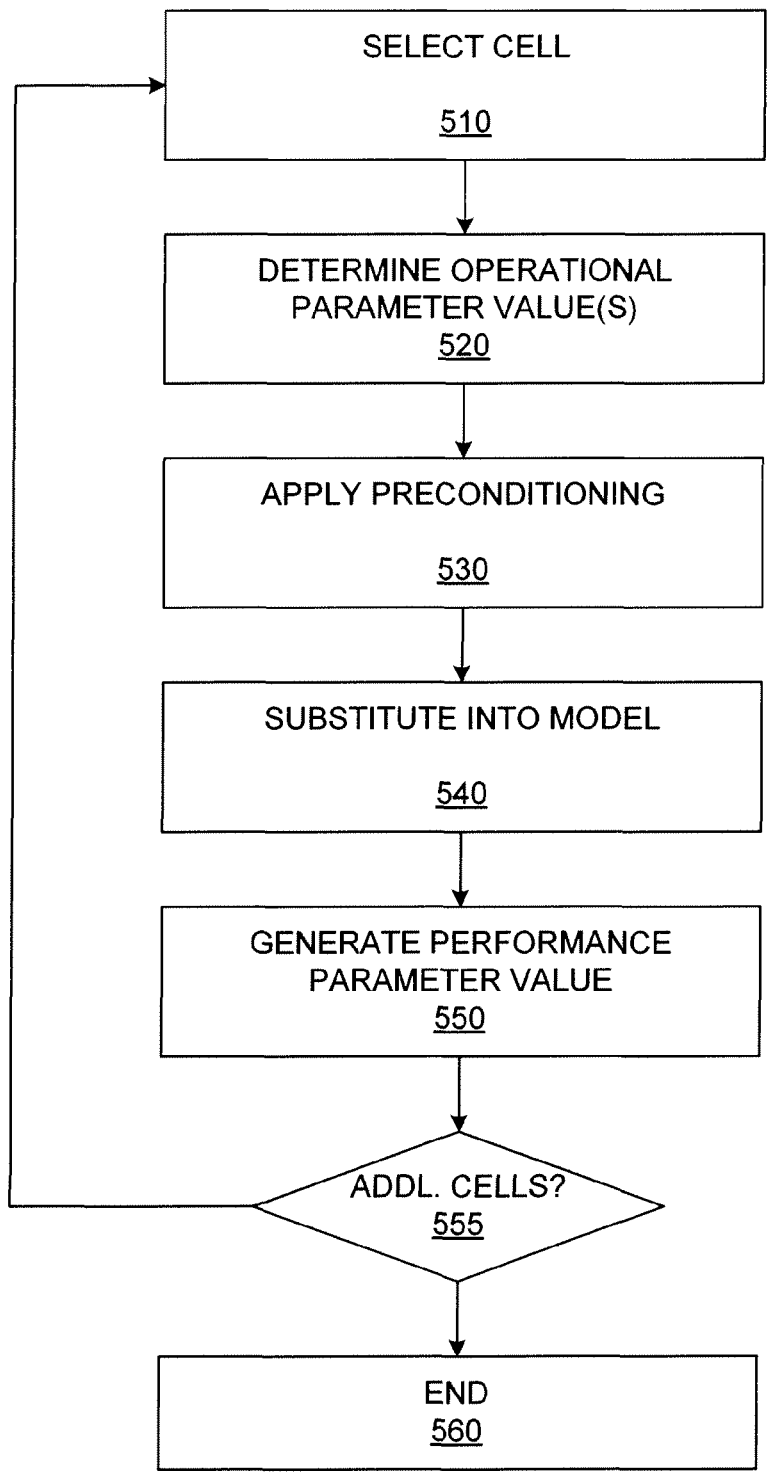
FIG. 5 is a flow diagram of a process for performing an EDA analysis using a cell library that includes preconditioning functions.

FIG. 5 shows a flow diagram for an analysis process (e.g., synthesis or static timing analysis) using a characterized cell library employing preconditioning functions, in accordance with an embodiment of the invention. In a "SELECT CELL" step 510, a first cell in an IC design is selected. Then, in a "DETERMINE OPERATIONAL PARAMETER VALUE (S)" step 520, one or more operational parameter values (e.g., values for input slew and output capacitance) associated with a performance parameter type (e.g., delay) are specified for that cell. Next, in an "APPLY PRECONDITIONING" step 530, the preconditioning function(s) associated with the cell are applied to the operational parameter value(s) to generate preconditioned input values.

Those preconditioned input values are then substituted into the mathematical model for the performance parameter type being calculated for the cell in a "SUBSTITUTE IN TO MODEL" step 540. The resulting output of the mathematical model is provided as the performance parameter value for the cell under the given conditions, in a "GENERATE PERFORMANCE PARAMETER VALUE" step 550 (note that if the mathematical model was derived using preconditioned performance parameter data, step 550 involves applying an inverse preconditioning function to the output of the mathematical model to generate the performance parameter value for the cell). Then, in an "ADDITIONAL CELLS?" step 555, if more cells in the IC design remain to be analyzed, the process loops back to step 510, where a new cell is selected. Otherwise, the process ends at "END" step 560.

In this manner, preconditioning functions associated with a cell library can be used to accurately and efficiently model the behavior of cell elements and therefore allows more efficient IC designs. Because the preconditioning can be implemented in a cell library that may only differ from a conventional polynomial-based library by a set of preconditioning functions, conventional EDA systems can be readily adapted to make use of a cell library in accordance with the invention.

The various embodiments of the structures and methods of this invention that are described above are illustrative only of the principles of this invention and are not intended to limit the scope of the invention to the particular embodiments described. Thus, the invention is limited only by the following claims and their equivalents.

The invention claimed is:

1. A method for performing an electronic design automation (EDA) analysis, the method comprising:
   selecting a cell in a circuit design;
   determining a value for a first operational parameter associated with the cell;
   selecting a mathematical model for a performance parameter of the cell from a cell library, the mathematical model being a function of a first input variable;
   generating a value for the first input variable by applying a first preconditioning function to the value for the first operational parameter, the first preconditioning function being associated with the mathematical model in the cell library; and
   generating a value for the performance parameter of the cell by substituting the value for the first operational parameter into the mathematical model.

2. The method of claim 1, wherein the mathematical model for the performance parameter of the cell is further a function of a second operational parameter,
   the method further comprising determining a value for the second operational parameter associated with the cell,
   wherein generating the value for the performance parameter of the cell further comprises substituting the value for the second operational parameter into the mathematical model.

3. The method of claim 1, wherein the mathematical model for the performance parameter of the cell is further a function of a second input variable, the method further comprising:
   determining a value for a second operational parameter associated with the cell;
   generating a value for the second input variable by applying a second preconditioning function to the value for the second operational parameter, the second preconditioning function being associated with the mathematical model in the cell library, wherein generating the value for the performance parameter of the cell further comprises substituting the value for the second operational parameter into the mathematical model.

4. The method of claim 1, further comprising determining a value for a second operational parameter associated with the cell, wherein generating the value for the first input variable further comprises applying the first preconditioning function to the value for the second operational parameter, the first preconditioning function being a function of the first operational parameter and the second operational parameter.

5. The method of claim 1, wherein the mathematical model comprises a scalable polynomial model.

* * * * *